US012631677B2

(12) United States Patent (10) Patent No.: US 12,631,677 B2

Tonegawa (45) Date of Patent: May 19, 2026

(54) SEMICONDUCTOR DEVICE INCLUDING SEPARATED ELECTRODE PADS AND METHOD OF MANUFACTURING THE SAME

(71) Applicant: RENESAS ELECTRONICS CORPORATION, Tokyo (JP)

(72) Inventor: Takashi Tonegawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 814 days.

(21) Appl. No.: 17/885,955

(22) Filed: Aug. 11, 2022

(65) Prior Publication Data

US 2023/0111921 A1 Apr. 13, 2023

(30) Foreign Application Priority Data

Oct. 12, 2021 (JP) ................................. 2021-167518

(51) Int. Cl.
H01L 23/00 (2006.01)
G01R 31/26 (2020.01)
(Continued)

(52) U.S. Cl.
CPC ......... G01R 31/2608 (2013.01); H10D 64/01 (2025.01); H10D 64/231 (2025.01);
(Continued)

(58) Field of Classification Search
CPC ......... H01L 24/06; H01L 24/03; H01L 24/05; H01L 24/37; H01L 24/45; H01L 2224/03464; H01L 2224/05026; H01L 2224/05083; H01L 2224/05124; H01L 2224/05155; H01L 2224/05164; H01L 2224/05166; H01L 2224/05184; H01L 2224/05562; H01L 2224/05571; H01L 2224/05573; H01L 2224/05644; H01L 2224/0603; H01L 2224/06051; H01L 2224/0616; H01L 2224/3702;
(Continued)

(56) References Cited

U.S. PATENT DOCUMENTS 5,170,312 A 12/1992 Davies et al.
10,304,951 B2 * 5/2019 Matsuura ............. H10D 12/441
(Continued)

FOREIGN PATENT DOCUMENTS

JP H5-218289 A 8/1993
JP 2004158868 A * 6/2004
(Continued)

OTHER PUBLICATIONS

JP-2004158868 A translation (Year: 2004).*
(Continued)

*Primary Examiner* — William B Partridge
*Assistant Examiner* — Linda J. Fleck
(74) *Attorney, Agent, or Firm* — Rimon P.C.

(57) ABSTRACT

First conductive layer is connected to an impurity region which is a source region or an emitter region. A first conductive layer having an emitter pad and a second conductive layer having a Kelvin emitter pad and a relay pad are separated. A plane occupied area of the Kelvin emitter pad is smaller than a plane occupied area of the emitter pad.

9 Claims, 14 Drawing Sheets

(51) Int. Cl.

| | |
|---|---|
| *H10D 12/00* | (2025.01) |
| *H10D 30/66* | (2025.01) |
| *H10D 64/01* | (2025.01) |
| *H10D 64/23* | (2025.01) |
| *H10D 64/62* | (2025.01) |
| *H10W 72/00* | (2026.01) |
| *H10W 72/50* | (2026.01) |
| *H10W 72/60* | (2026.01) |
| *H10W 72/90* | (2026.01) |

(52) U.S. Cl.
CPC ......... *H10D 64/252* (2025.01); *H10D 12/481* (2025.01); *H10D 30/668* (2025.01); *H10D 64/62* (2025.01); *H10W 72/01935* (2026.01); *H10W 72/07554* (2026.01); *H10W 72/541* (2026.01); *H10W 72/641* (2026.01); *H10W 72/652* (2026.01); *H10W 72/90* (2026.01); *H10W 72/923* (2026.01); *H10W 72/926* (2026.01); *H10W 72/936* (2026.01); *H10W 72/9415* (2026.01); *H10W 72/942* (2026.01); *H10W 72/9445* (2026.01); *H10W 72/952* (2026.01)

(58) Field of Classification Search
CPC . H01L 2224/37139; H01L 2224/37147; H01L 2224/4502; H01L 2224/4918; H01L 2924/13055; H01L 2924/13091; G01R 31/2608; H10D 64/01; H10D 64/231; H10D 64/252; H10D 64/232; H10D 64/62; H10D 12/481; H10D 30/668; H10D 30/669; H10D 62/393; H10W 72/01935; H10W 72/07554; H10W 72/541; H10W 72/641; H10W 72/652; H10W 72/90; H10W 72/923; H10W 72/926; H10W 72/936; H10W 72/9415; H10W 72/942; H10W 72/9445; H10W 72/952

See application file for complete search history.

(56) References Cited

U.S. PATENT DOCUMENTS

| | | | | |
|---|---|---|---|---|
| 10,714,603 | B2 * | 7/2020 | Naito | ................... H10D 64/232 |
| 2009/0079006 | A1 | 3/2009 | Tanaka et al. | |
| 2013/0009300 | A1 | 1/2013 | Yato et al. | |
| 2017/0025336 | A1 * | 1/2017 | Padmanabhan | ... H01L 23/49524 |
| 2018/0102308 | A1 * | 4/2018 | Nishiwaki | ........ H01L 23/49513 |
| 2018/0138136 | A1 * | 5/2018 | Tonegawa | ........... H10D 64/256 |
| 2020/0066665 | A1 * | 2/2020 | Okawara | ................ H01L 24/06 |
| 2021/0336017 | A1 * | 10/2021 | Ueda | ....................... H01L 25/18 |
| 2023/0155012 | A1 * | 5/2023 | Yoshida | ................. H01L 24/49 |
| | | | | 257/213 |
| 2023/0411323 | A1 * | 12/2023 | Watanabe | ............... H01L 24/03 |
| 2024/0371995 | A1 * | 11/2024 | Hikasa | .................... H10D 8/00 |

FOREIGN PATENT DOCUMENTS

| | | | | |
|---|---|---|---|---|
| JP | 2009-081198 | A | | 4/2009 |
| JP | 2018-81982 | A | | 5/2018 |
| JP | 2021027135 | A | * | 2/2021 |
| JP | 2021-111641 | A | | 8/2021 |
| WO | 2011-121756 | A1 | | 10/2011 |
| WO | WO-2018074425 | A1 | * | 4/2018 ........... H01L 21/266 |

OTHER PUBLICATIONS

JP 2021027135A Espacenet translation (Year: 2021).*
Office Action dated Dec. 17, 2024, from corresponding Japanese Application No. 2021-167518, 8 pages.

* cited by examiner

SEMICONDUCTOR DEVICE INCLUDING SEPARATED ELECTRODE PADS AND METHOD OF MANUFACTURING THE SAME

CROSS-REFERENCE TO RELATED APPLICATIONS

The disclosure of Japanese Patent Application No. 2021-167518 filed on Oct. 12, 2021, including the specification, drawings and abstract is incorporated herein by reference in its entirety.

BACKGROUND

The present invention relates to a semiconductor device and method of manufacturing the same, for example, the present invention can be suitably applied to a semiconductor device and a method of manufacturing the same, which has electrode pads for detecting potentials of sources or emitters.

There are disclosed techniques listed below.
[Patent Document 1] Japanese Unexamined Patent Application Publication No. 2021-111641
Patent Document 1 discloses an IGBT (Insulated Gate Bipolar Transistor) having an emitter electrode with a large area and an electrode pad with a small area for Kelvin emitter. The electrode pad for the Kelvin emitter is used to detect the potential of the emitter electrode.

SUMMARY

In the electrode pad for the Kelvin emitter with small area electrically connected to the emitter electrode with large area, there is a possibility that the connection portion of a bonding wire or a clip conductor is peeled off.

Other objects and novel features will become apparent from the description of this specification and the accompanying drawings.

According to a semiconductor device of one embodiment, a first conductive layer is connected to an impurity region that is a source region or an emitter region. The first conductive layer having a first electrode pad and a second conductive layer having a second electrode pad and a third electrode pad are separated from each other. The first electrode pad and the third electrode pad are electrically connected. A plane occupied area of the second electrode pad is smaller than a plane occupied area of the first electrode pad.

According to a method of manufacturing a semiconductor device according to one embodiment, it includes the following steps. A first conductive layer connected to an impurity region that is a source region or an emitter region arranged in a semiconductor substrate and a second conductive layer separated from the first conductive layer are formed on a main surface of the semiconductor substrate. A first electrode pad of the first conductive layer and a third electrode pad of the second conductive layer are electrically connected. A plane occupied area of the second electrode pad is smaller than a plane occupied area of the first electrode pad.

According to the above embodiment, it is possible to realize a semiconductor device and a method of manufacturing the same, in which the connection portion of the bonding wire or the clip conductor is hard to be peeled off.

BRIEF DESCRIPTION OF THE DRAWINGS

FIG. 1 is a plan view showing the configuration of a semiconductor device according to first embodiment.

FIG. 4 is a cross-sectional view showing a first step of a manufacturing method of the semiconductor device according to the first embodiment.

FIG. 5 is a cross-sectional view showing a second step of the manufacturing method of the semiconductor device according to the first embodiment.

FIG. 6 is a cross-sectional view showing a third step of the manufacturing method of the semiconductor device according to the first embodiment.

FIG. 7 is a plan view showing a configuration of the semiconductor device of a comparative example.

FIG. 8 is a cross-sectional view along line VIII-VIII in FIG. 7.

FIG. 12 is a plan view showing a configuration of a semiconductor device according to third embodiment.

FIG. 13 is a cross-sectional view along line XIII-XIII in FIG. 12.

DETAILED DESCRIPTION

Figure 2:
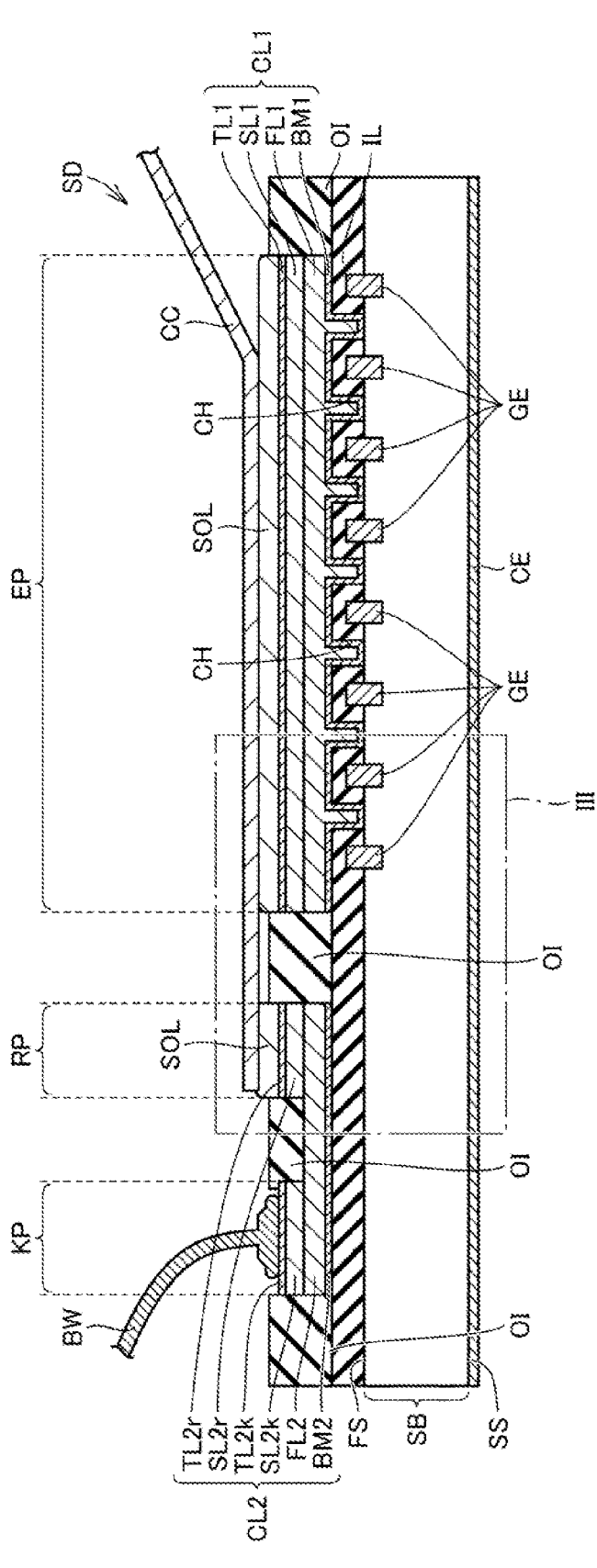
FIG. 2 is a cross-sectional view along line II-II in FIG. 1.

Hereinafter, embodiments of the present disclosure will be described in detail with reference to the drawings. In the specification and drawings, the same or corresponding components are denoted by the same reference numerals, and a repetitive description thereof is not repeated. In the drawings, for convenience of explanation, the configuration or manufacturing method may be omitted or simplified. Also, at least some of the embodiments may be arbitrarily combined with each other.

Note that a plan view in this specification means a viewpoint viewed from a direction perpendicular to a first surface FS of the semiconductor substrate. A planar shape also means a shape in plan view.

First Embodiment

Configuration of Semiconductor Device

Figure 01:
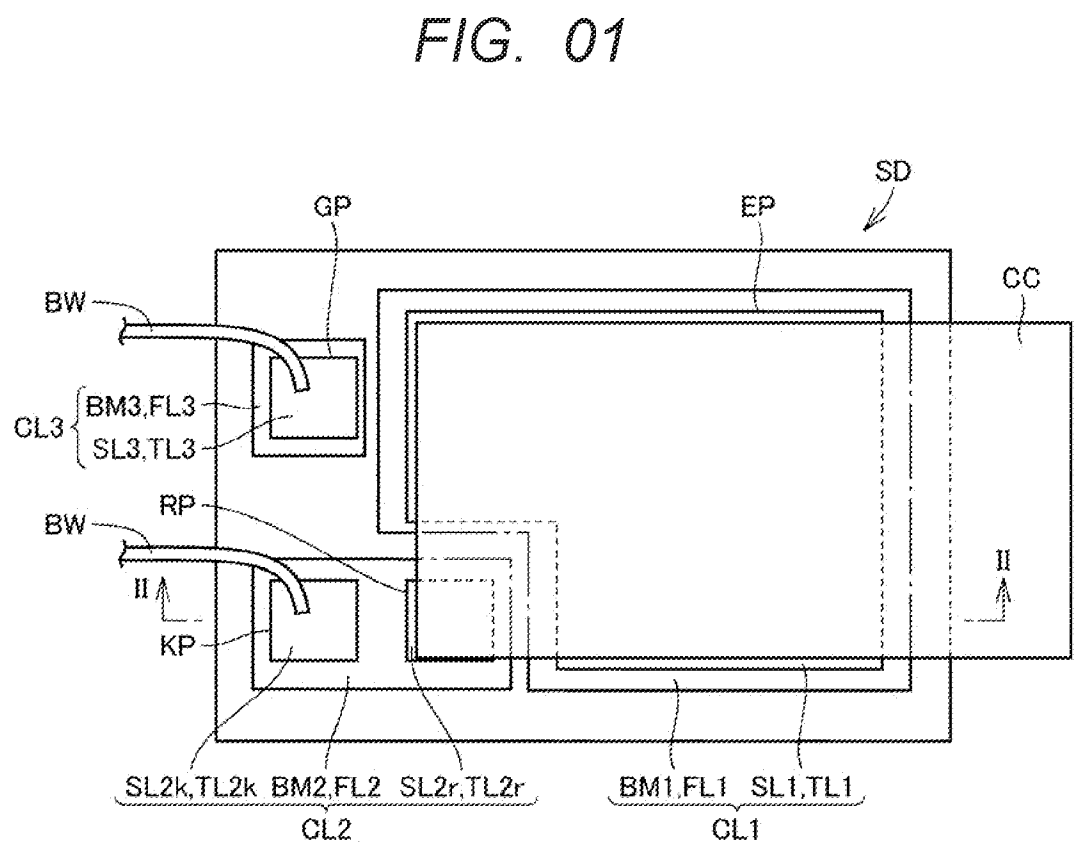

First, the configuration of the semiconductor device according to the first embodiment will be described with reference to FIGS. 1 to 3.

As shown in FIG. 1, the semiconductor device SD in the present embodiment has an emitter pad EP (first electrode pad), a Kelvin emitter pad KP (second electrode pad), a relay pad RP (third electrode pad), and a gate pad GP. The plane occupied area of the emitter pad EP is larger than the plane occupied area of each of the Kelvin emitter pad KP, the relay pad RP and the gate pad GP.

The emitter pad EP has a substantially L-shaped planar shape which is one corner portion of the rectangle is notched. Each of the Kelvin emitter pad KP, the relay pad RP and the gate pad GP has a rectangular planar shape. The relay pad RP is arranged in a rectangular notched region in the planar shape of the emitter pad EP.

The emitter pad EP and the relay pad RP are electrically connected to each other. Each of the emitter pad EP and the relay pad RP is electrically connected to a common clip conductor CC, for example. The clip conductor CC is a plate-shaped conductor. The clip conductor CC is made of metal having a low electrical resistivity such as copper (Cu), silver (Ag), for example.

By using the clip conductor CC, it is possible to flow more current than when connecting a bonding wire to the emitter pad EP. On the other hand, a bonding wire BW is individually connected to each of the Kelvin emitter pad KP and the gate pad GP. Although described here where the bonding wire BW is connected to each of the Kelvin emitter pad KP and the gate pad GP, the clip conductor may be connected to each of the Kelvin emitter pad KP and the gate pad GP.

As shown in FIG. 2, the semiconductor device SD have the semiconductor substrate SB. The semiconductor substrate SB has a first surface FS (main surface) and a second surface SS that face each other. In the semiconductor substrate SB, an electric element having a vertical-type insulated gate field effect transistor portion is formed. The electric element is, for example, an IGBT. The vertical-type electric element means an electric element in which a current flows between the first surface FS and the second surface SS of the semiconductor substrate SB.

An interlayer dielectric layer IL is arranged on the first surface FS of the semiconductor substrate SB. Contact holes CH are provided in the interlayer dielectric layer IL. The contact hole CH reaches the first surface FS of the semiconductor substrate SB from an upper surface of the interlayer dielectric layer IL.

The semiconductor device SD further includes a first conductive layer CL1, a second conductive layer CL2, and a third conductive layer CL3 (FIG. 1). Each of the first conductive layer CL1, the second conductive layer CL2, and the third conductive layer CL3 is arranged on the first surface FS of the semiconductor substrate SB and on the interlayer dielectric layer IL.

The first conductive layer CL1 is directly connected to the emitter region (impurity region) of the IGBT via the contact hole CH of the interlayer dielectric layer IL. The first conductive layer CL1 has the emitter pad EP. In a region directly below the first conductive layer CL1, a gate electrode GE of the IGBT is arranged.

The second conductive layer CL2 is arranged separately from the first conductive layer CL1. The second conductive layer CL2 is not directly connected to the emitter region (impurity region) of the IGBT. The second conductive layer CL2 has the Kelvin emitter pad KP and the relay pad RP. In a region directly below the second conductive layer CL2, the gate electrode GE of the IGBT is not arranged.

The third conductive layer CL3 is arranged separately from each of the first conductive layer CL1 and the second conductive layer CL2. The third conductive layer CL3 is electrically connected to the gate electrode GE of the IGBT via a contact hole (not shown) of the interlayer dielectric layer IL. The third conductive layer CL3 has the gate pad GP.

The first conductive layer CL1 has a barrier metal layer BM1, a first layer FL1, a second layer SL1, and a third layer TL1. The barrier metal layer BM1 is arranged in contact with the upper surface of the interlayer dielectric layer IL and a wall surface of the contact hole CH. The barrier metal layer BM1 is made of, for example, titanium-tungsten (TiW). The barrier metal layer BM1 may be a single layer of titanium (Ti) or titanium nitride (TiN), also may be a laminated film of titanium and titanium nitride.

The first layer FL1 is arranged in contact with an upper surface of the barrier metal layer BM1 and embeds the contact hole CH. The first layer FL1 is made of, for example, material containing aluminum (Al), and is made of, for example, an alloy of aluminum and silicon (Si), an alloy of aluminum and copper, an alloy of aluminum, silicon, and copper, or pure aluminum.

The second layer SL1 is arranged on the first layer FL1. The second layer SL1 is made of material containing first metal. The first metal is metal different from aluminum, for example, nickel (Ni). The first metal may contain a small amount of phosphorus (P) in nickel (Ni)

Zinc (Zn) may exist between the first layer FL1 and the second layer SL1. Zinc is the rest of the zinc layer formed when performing a zincate treatment to the first layer FL1.

The third layer TL1 is arranged in contact with an upper surface of the second layer SL1. The third layer TL1 is made of material containing second metal. The second metal is metal different from the first metal, for example gold (Au). The second metal may be a two-layer structure in which gold is formed on palladium (Pd) The emitter pad EP is configured by exposing an upper surface of the third layer TL1 from the dielectric layer OI.

The second conductive layer CL2 includes a barrier metal layer BM2, a first layer FL2, second layers SL2k, SL2r, and third layers TL2k, TL2r. The barrier metal layer BM2 is arranged in contact with the upper surface of the interlayer dielectric layer IL. The barrier metal layer BM2 is made of, for example, titanium-tungsten.

The first layer FL2 is arranged in contact with an upper surface of the barrier metal layer BM2. The first layer FL2 is made of material containing aluminum, for example, and is made of pure aluminum, for example.

Each of the second layers SL2k, SL2r is arranged on the first layer FL2. The second layer SL2k and the second layer SL2r are separated from each other, but are electrically connected to each other via the first layer FL2. Each of the second layers SL2k, SL2r is made of material containing first metal. The first metal is metal different from aluminum, for example, nickel.

Zinc may exist between each of the second layers SL2k, SL2r and the first layer FL2. Zinc is the rest of the zinc layer formed when performing a zincate treatment to the first layer FL2.

The third layer TL2k is arranged in contact with an upper surface of the second layer SL2k. The third layer TL2r is arranged in contact with an upper surface of the second layer SL2r. Each of the third layers TL2k, TL2r is made of material containing second metal. The second metal is metal different from the first metal, for example gold.

The Kelvin emitter pad KP is configured by exposing an upper surface of the third layer TL2k from the dielectric layer OI. The relay pad RP is configured by exposing an upper surface of the third layer TL2r from the dielectric layer OI. The Kelvin emitter pad KP and the relay pad RP are electrically connected to each other via the first layer FL2.

The third conductive layer CL3 (FIG. 1) has a barrier metal layer BM3, a first layer FL3, a second layer SL3, and a third layer TL3. The barrier metal layer BM3 is arranged in contact with the upper surface of the interlayer dielectric layer IL and the inner wall surface of the contact hole. Thus the barrier metal layer BM3 is directly connected to the gate electrode GE.

The first layer FL3 is arranged in contact with an upper surface of the barrier metal layer BM3. The second layer SL3 is arranged on the first layer FL3. The third layer TL3 is arranged in contact with an upper surface of the second layer SL3. The gate pad GP is configured by exposing an upper surface of the third layer TL3 from the dielectric layer OI.

Since the configuration of the third conductive layer CL3 other than the above is substantially the same as the configuration of the first conductive layer CL1, the description thereof will not be repeated.

The clip conductor CC is arranged on the emitter pad EP and the relay pad RP. The clip conductor CC is electrically connected to each of the emitter pad EP and the relay pad RP via a solder SOL. That is, the clip conductor CC is connected to each of the upper surface of the third layer TL1 and the upper surface of the third layer TL2$r$ via the solder SOL. Thus, the first conductive layer CL1 and the second conductive layer CL2 are electrically connected to each other. In the connection between the clip conductor CC and each of the emitter pad EP and the relay pad RP, a bonding method of Ag sinter or Ag paste may be used other than solder.

A bonding wire BW is electrically connected to the Kelvin emitter pad KP. That is, the bonding wire BW is connected to the upper surface of the third layer TL2$k$.

The bonding wire BW is electrically connected to the gate pad GP (FIG. 1). That is, the bonding wire BW is connected to the upper surface of the third layer TL3.

Incidentally, the dielectric layer OI described above is made of material containing an organic insulator. The organic insulator included in the dielectric layer OI is, for example, polyimide. The dielectric layer OI separates the first conductive layer CL1, the second conductive layer CL2, and the third conductive layer CL3 from each other by being located between the first conductive layer CL1, the second conductive layer CL2, and the third conductive layer CL3.

A collector electrode CE is arranged on the second surface SS of the semiconductor substrate SB. The collector electrode CE is electrically connected to the collector region of the IGBT.

Figure 3:
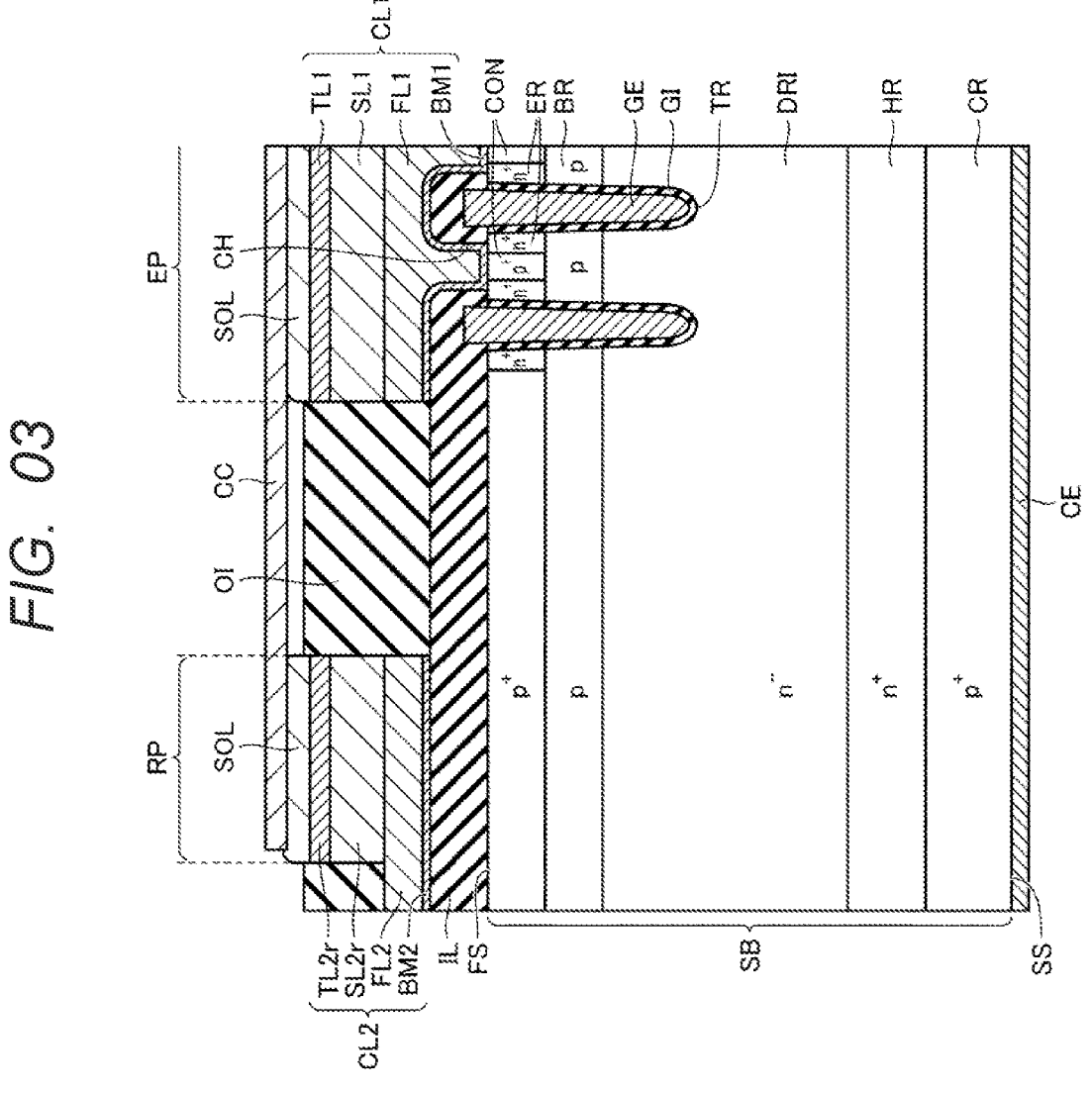
FIG. 3 is an enlarged cross-sectional view of part III of FIG. 2.

As shown in FIG. 3, the electric element formed in the semiconductor substrate SB is, for example, IGBT. The IGBT has a p$^+$-type collector region CR, an n$^+$-type region HR, an n$^-$-type drift region DRI, a p-type base region BR, a p$^+$-type contact region CON, an n$^+$-type emitter region ER, and a gate electrode GE.

The p$^+$-type collector region CR is arranged on the second surface SS of the semiconductor substrate SB. The n$^+$-type region HR is arranged on the p-type collector region CR (the first surface FS side with respect to the p$^+$-type collector region CR). The n$^+$-type region HR forms a pn junction with the p-type collector region CR.

The n$^-$-type drift region DRI is arranged on the n$^+$-type region HR (the first surface FS side with respect to the n$^+$-type region HR). The n$^-$-type drift region DRI is in contact with the n$^+$-type region HR. The n$^-$-type drift region DRI has an n$^+$-type impurity concentration lower than an n-type impurity concentration of the n$^+$-type region HR.

The p-type base region BR is arranged on the n$^-$-type drift region DRI (the first surface FS side with respect to the n$^-$-type drift region DRI). The p-type base region BR forms a pn junction with the n$^-$-type drift region DRI.

The p$^+$-type contact region CON and the n$^+$-type emitter region ER are arranged on the p-type base region BR (first side FS side with respect to the p-type base region BR). The p$^+$-type contact region CON is in contact with the p-type base region BR. The p-type base region BR has a p-type impurity concentration higher than a p-type impurity concentration of the p-type base region BR. The n$^+$-type emitter region ER forms a pn junction with each of the p$^+$-type contact region CON and the p-type base region BR.

Trenches TR are provided in the semiconductor substrate SB. The trench TR reaches the n$^-$-type drift region DRI from the first surface FS through the n$^+$-type emitter region ER and the p-type base region BR. The gate dielectric layer GI is arranged along the inner wall of the trench TR. The inside of the trench TR is filled by the gate electrode GE. The gate electrode GE faces the p-type base region BR via the gate dielectric layer GI. Thus the IGBT has an insulated gate field effect transistor portion.

The first conductive layer CL1 configures the emitter electrode by being in contact with the n$^+$-type emitter region via the contact hole CH of the interlayer dielectric layer IL. The first conductive layer CL1 is also in contact with the p$^-$-type contact region CON via the contact hole CH1.

The collector electrode CE is arranged on the second surface SS of the semiconductor substrate SB. The collector electrode CE is electrically connected to the p$^+$-type collector region CR by contacting the p$^+$-type collector region CR.

Manufacturing Method of Semiconductor Device Next, a manufacturing method of the semiconductor device of the present embodiment will be described with reference to FIGS. 4 to 6.

Figure 04:
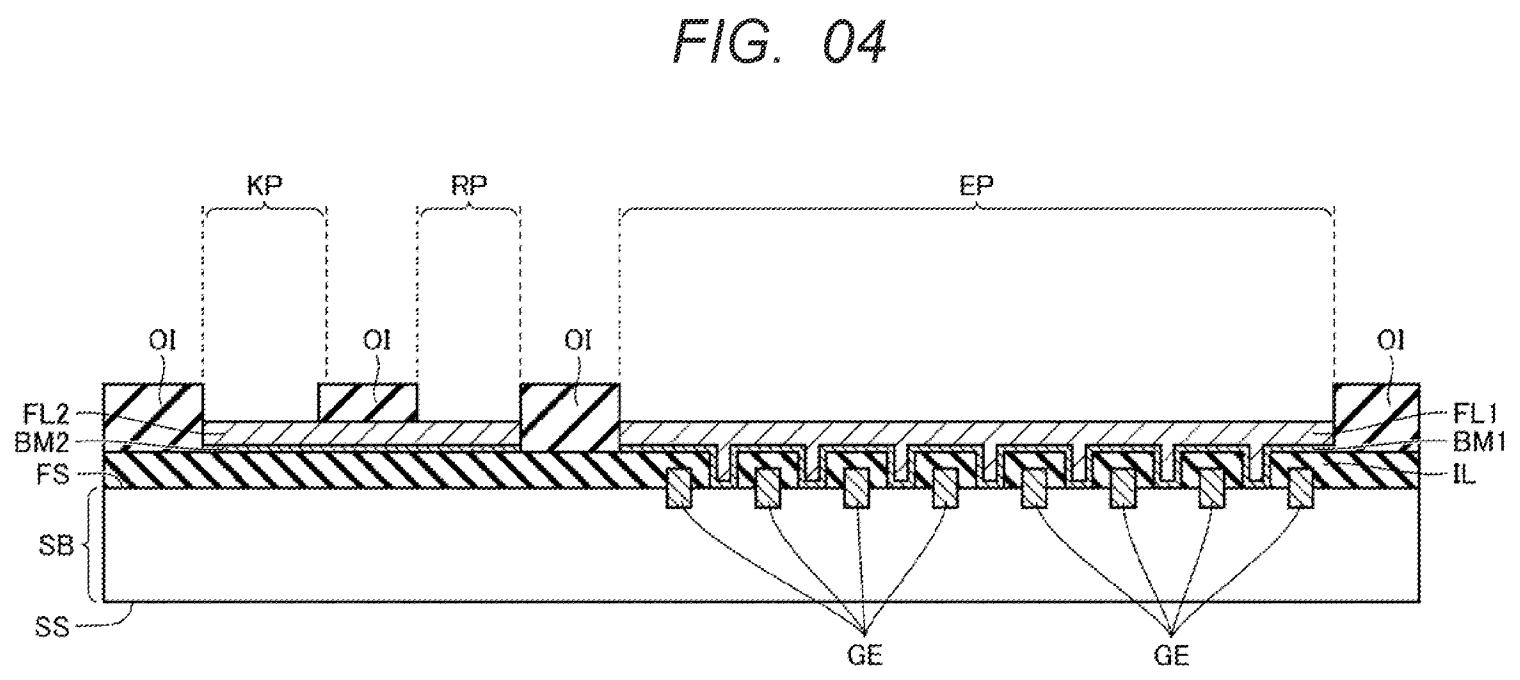

As shown in FIG. 4, first, the semiconductor substrate SB is prepared. The electric element (not shown) having the gate electrode GE such as IGBT is formed in the semiconductor substrate SB. To cover the first surface FS of the semiconductor substrate SB, for example, the interlayer dielectric layer IL formed of a silicon oxide film is formed. In the interlayer dielectric layer IL, the contact holes CH that reach the n$^+$-type emitter region ER and p$^+$-type contact region CON are formed by a photolithography technique and an etching technique.

On the interlayer dielectric layer IL, for example, a barrier metal layer made of titanium-tungsten, and a first layer made of an alloy of aluminum and silicon are formed by laminating in this order. The barrier metal layer is formed so as to directly contact each of the n$^+$-type emitter region ER and the p$^+$-type contact region CON via the contact hole CH.

The barrier metal layer and the first layer are patterned by a photolithography technique and an etching technique. As a result, the barrier metal layer is separated into the barrier metal layers BM1, BM2, BM3. The first layer is also separated into the first layers FL1, FL2, FL3. The laminated structure of the barrier metal layer BM1 and the first layer FL1, the laminated structure of the barrier metal layer BM2 and the first layer FL2, and the laminated structure of the barrier metal layer BM3 and the first layer FL3 are formed.

Thereafter, the organic dielectric layer OI is applied to the entire surface of the first surface FS of the semiconductor substrate SB. The organic dielectric layer OI is, for example, an organic photosensitive film, and is polyimide. The organic dielectric layer OI is patterned by a photolithography technique (exposure and development) to become the dielectric layer OI having a predetermined pattern shape. The dielectric layer OI is patterned so as to expose the portions to be each electrode pads EP, KP, RP, GP from the dielectric layer OI, as shown in FIG. 1. In particular, in order to separate between the electrode pads KP and RP, the dielectric layer OI has a portion located on the first layer FL2.

Figure 05:
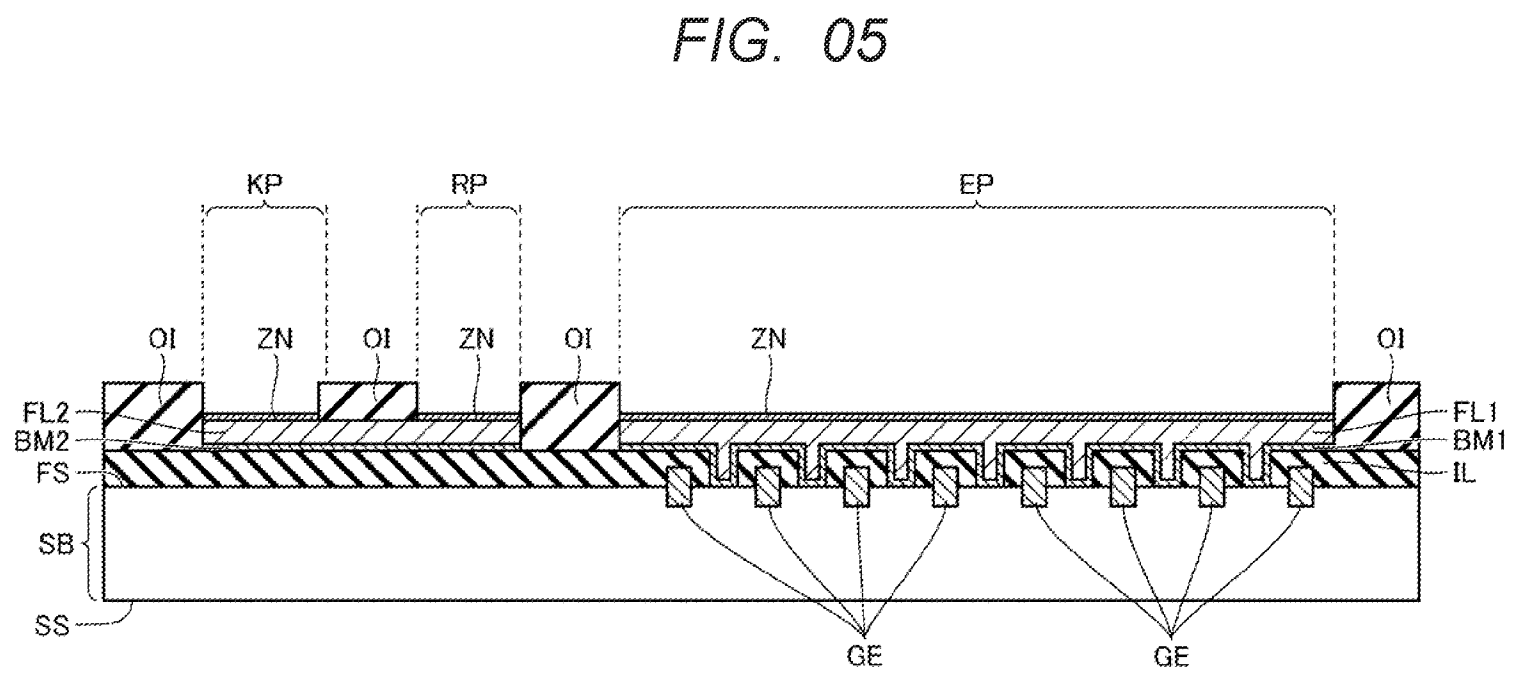
Figure 06:
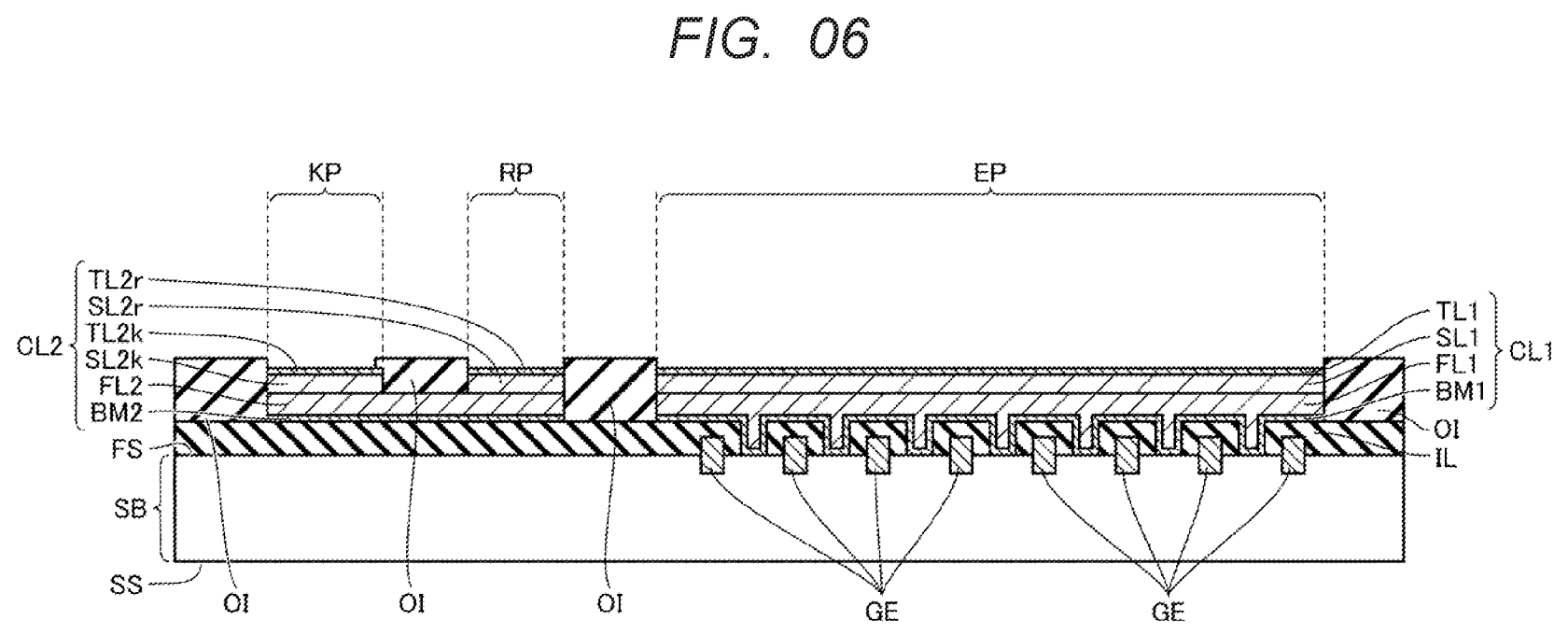

Using an electroless plating method as shown in FIGS. 5 and 6, nickel and gold are formed on the first layers FL1, FL2, FL3. By a degreasing treatment, the surfaces of the first layers FL1, FL2, FL3 are cleaned. By an etching treatment, the oxide layer on the surface is removed, and then, after an acid cleaning is performed, the first zincate treatment is performed. Next, zinc (Zn) formed in the first zincate treatment is removed with an acid cleaning. Next, as shown in FIG. 5, a second zincate treatment is performed on the first layers FL1, FL2, FL3. In the zincate treatment, zincate liquid is brought into contact with the surface, and a zinc coating is formed on the surface by a substitution reaction of aluminum and zinc. The zincate treatment is performed to facilitate plating on the aluminum surface. To the first layers FL1, FL2, FL3 on which zinc coating ZN is formed, for example, nickel plating and gold plating are performed as an electroless plating. A pure water cleaning treatment is performed between each process.

As shown in FIG. 6, the second layer SL1 made of nickel and the third layer TL1 made of gold are formed on the first layer FL1 by the nickel plating and the gold plating. Thus, the upper surface of the third layer TL1 configures the emitter pad EP.

The second layers SL2*k*, SL2*r* made of nickel and the third layers TL2*k*, TL2*r* made of gold are formed on the first layer FL2. The laminated structure of the second layer SL2*k* and the third layer TL2*k* is formed separately from the laminated structure of the second layer SL2*k* and the third layer TL2*k*. Thus, the upper surface of the third layer TL2*k* configures the Kelvin emitter pad KP. The upper surface of the third layer TL2*r* configures the relay pad RP.

Although not shown, the second layer SL3 made of nickel and the third layer TL3 made of gold are formed on the first layer FL3. Thus, the upper surface of the third layer TL3 configures the gate pad GP.

By nickel plating, almost no zinc coating ZN remains on the surfaces of the first layers FL1, FL2, FL3. However, a small amount of zinc may remain on the surface of each of the first layers FL1, FL2, FL3.

As shown in FIG. 2, after the second surface SS of the semiconductor substrate SB is polished to a predetermined thickness, the collector electrode CE is formed on the second surface SS. In the collector electrode CE, an alloy of aluminum (Al) and silicon (Si), titanium (Ti), nickel (Ni), gold (Au) are formed from the semiconductor substrate SB side. Thereafter, the semiconductor wafer is diced and divided into a plurality of semiconductor chips. In the semiconductor chip state, the clip conductor CC is connected to the emitter pad EP and the relay pad RP by solder SOL. The bonding wire BW is also connected to each of the emitter pad EP and the gate pad GP.

Note that palladium (Pd) plating may be performed between nickel plating and gold plating.

As described above, the semiconductor device SD of the present embodiment is manufactured.
Effect Next, the effect of the present embodiment will be described in comparison with the comparative example shown in FIGS. 7 and 8.

Figure 07:
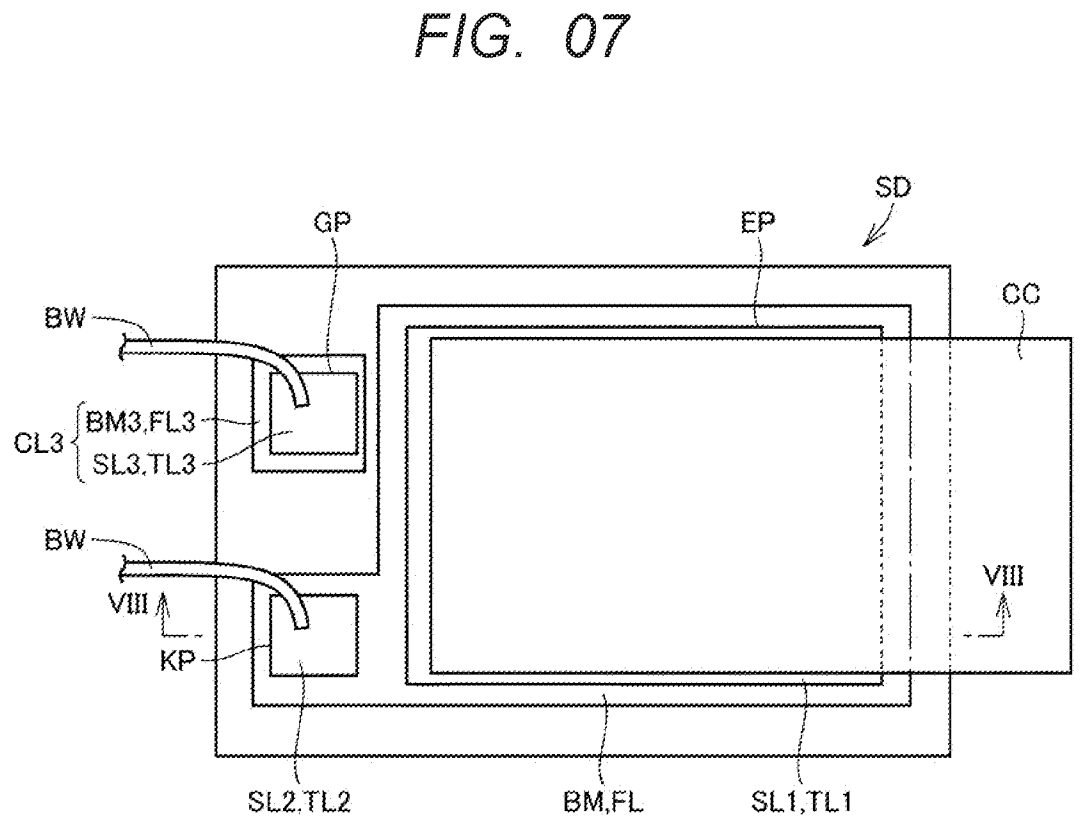
Figure 08:
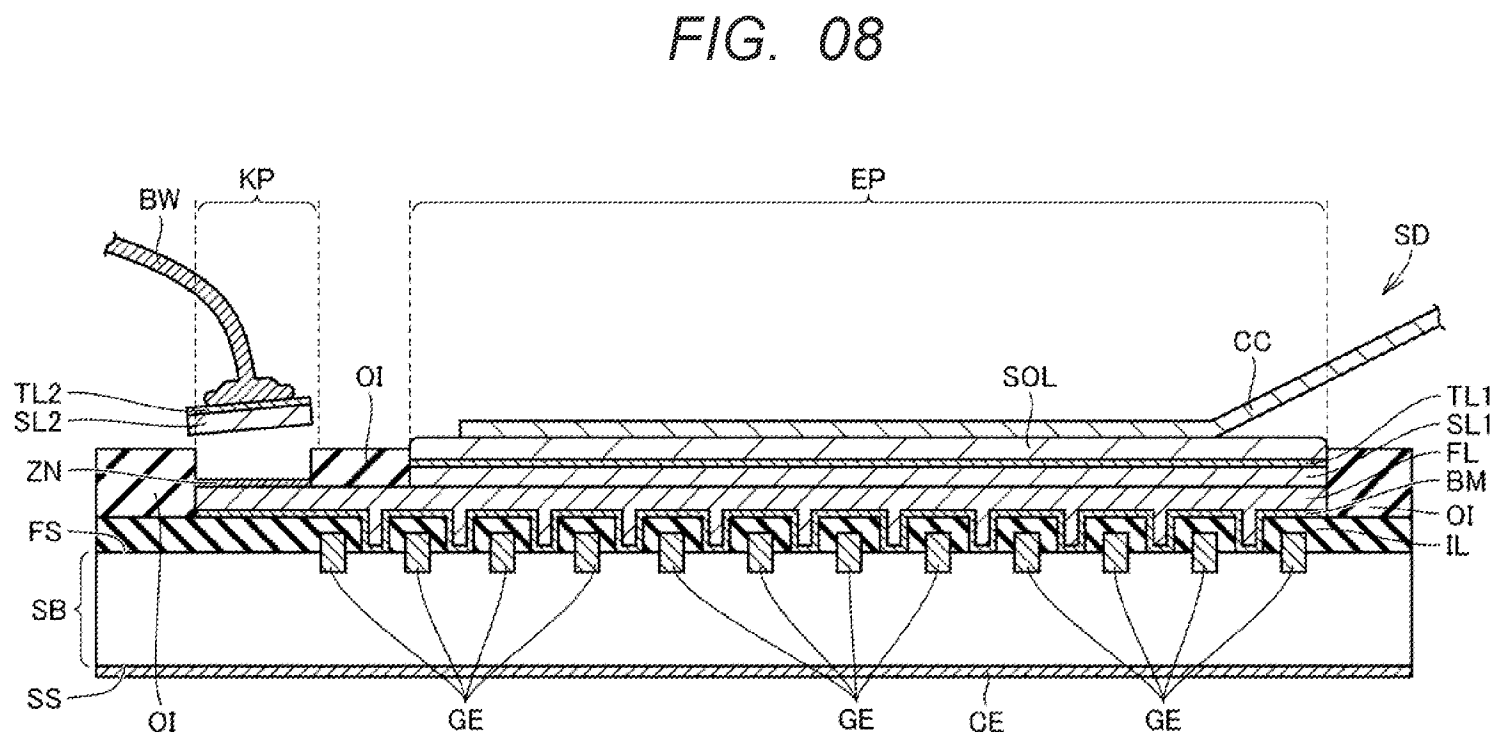

As shown in FIGS. 7 and 8, in the comparative example, the emitter pad EP and the Kelvin emitter pad KP are electrically connected to each other by sharing the barrier metal layer BM and the first layer FL made of aluminum. Therefore, in the comparative example, there is no need to electrically connect the emitter pad EP and the Kelvin emitter pad KP by the clip conductor CC. Therefore, the relay pad is not provided in the comparative example.

Since the configuration of the comparative example other than the above is substantially the same as the configuration of the present embodiment, the same elements are denoted by the same reference numerals, and the description thereof will not be repeated.

As shown in FIG. 8, in the comparative example, the emitter pad EP and the Kelvin emitter pad KP share the first layer FL made of aluminum. The first layer FL is exposed in a large area from the dielectric layer OI in a region serving as the emitter pad EP, and is exposed in a small area from the dielectric layer OI in a region serving as the Kelvin emitter pad.

Al in the first layer FL causes $Al\rightarrow Al^{3+}+3^{e-}$ reaction during the zincate treatment of the first layer FL made of aluminum. $Zn^{2+}$ in the chemical solution obtains the electrons ($e^-$) in the first layer FL, causing $Zn^{2+}+2^{e-}\rightarrow Zn$ reaction. Thus, the zinc coating ZN is formed on the first layer FL. The reaction stops when the entire surface of the aluminum surface is replaced with Zn.

In the zincate treatment, $Zn^{2+}$ in the chemical solution is not sufficiently supplied to the first layer FL of the emitter pad EP region exposed with a large area, and is sufficiently supplied to the first layer FL of the Kelvin emitter pad KP region exposed with a small area. Therefore, electrons ($e^-$) remaining in the first layer FL move in the first layer FL from the emitter pad EP region side exposed with a large area to the Kelvin emitter pad KP region side exposed with a small area.

As a result, zinc is excessively deposited on the first layer FL in the Kelvin emitter pad KP region exposed with a small area, and a zinc film ZN having a thick film thickness is grown. In the Kelvin emitter pad KP region, the adhesion between the first layer FL and the second layer SL2 is reduced by the thick zinc coating ZN, peeling of the portion where the bonding wire BW is connected is likely to occur.

In contrast, in the present embodiment, as shown in FIG. 2, the first layer FL1 of the first conductive layer CL1 having the emitter pad EP and the first layer FL2 of the second conductive layer CL2 having the Kelvin emitter pad KP are separated from each other. Therefore, in the zincate treatment of the first layers FL1, FL2, no extra electrons ($e^-$) in the first layer FL1 move to the first layer FL2. Therefore, excessive deposition of zinc is prevented in each of the Kelvin emitter pad KP and the relay pad RP exposed with a small area. Therefore, peeling of the bonding wire connection portion due to excessive deposition of zinc is prevented.

Further, according to the present embodiment, as shown in FIG. 2, the clip conductor CC is arranged on the emitter pad EP and the relay pad RP, and is electrically connected to each of the emitter pad EP and the relay pad RP. Since the clip conductor CC is a plate-shaped conductor, it is possible to flow more current than the linear bonding wire.

Further, according to the present embodiment, as shown in FIG. 2, each of the first conductive layer CL1 and the second conductive layer CL2 has the first layers FL1, FL2 and the second layers SL1, SL2*k*, SL2*r*. Each of the first layers FL1, FL2 contains aluminum. The second layers SL1, SL2*k*, SL2*r* are arranged on the first layers FL1, FL2 and include first metal (e.g., nickel) different from aluminum. As described above, when the second layers SL1, SL2*k*, SL2*r* made of metal different from aluminum are formed on the first layers FL1, FL2 containing aluminum by electroless plating, the zincate treatment of the first layers FL1, FL2 is required. In the present embodiment, since excessive deposition of zinc due to the zincate treatment can be prevented, peeling of the connection portion of the bonding wire BW can be prevented.

In addition, according to the present embodiment, as shown in FIG. 2, when the above zincate treatment is performed, zinc may exist between the first layers FL1, FL2 and the second layers SL1, SL2*k*, SL2*r*. However, since excessive deposition of zinc due to the zincate treatment can be prevented as described above, even if a small amount of zinc remains, peeling of the connection portion of the bonding wire BW can be prevented.

Further, according to the present embodiment, as shown in FIG. 2, the gate electrode GE is not arranged in the region directly below the second conductive layer CL2. In addition, the second conductive layer CL2 is not directly connected to the n$^-$-type emitter region ER (impurity region). However, the gate electrode GE is arranged in a region directly below the first conductive layer CL1, and the gate electrode GE is directly connected to the n$^+$-type emitter region ER of the first conductive layer CL1. The first conductive layer CL1 and the second conductive layer CL2 are electrically connected to each other by the clip conductor CC. Therefore, the potential of the n$^+$-type emitter region ER can be measured at the Kelvin emitter pad KP of the second conductive layer CL2.

Incidentally, the present inventors have investigated the relationship between the ratio (EP/KP) of the plane occupied area of the emitter pad EP to the plane occupied area of the Kelvin emitter pad KP and the zinc deposition amount in the Kelvin emitter pad KP. The result is shown in FIG. 9.

Figure 9:
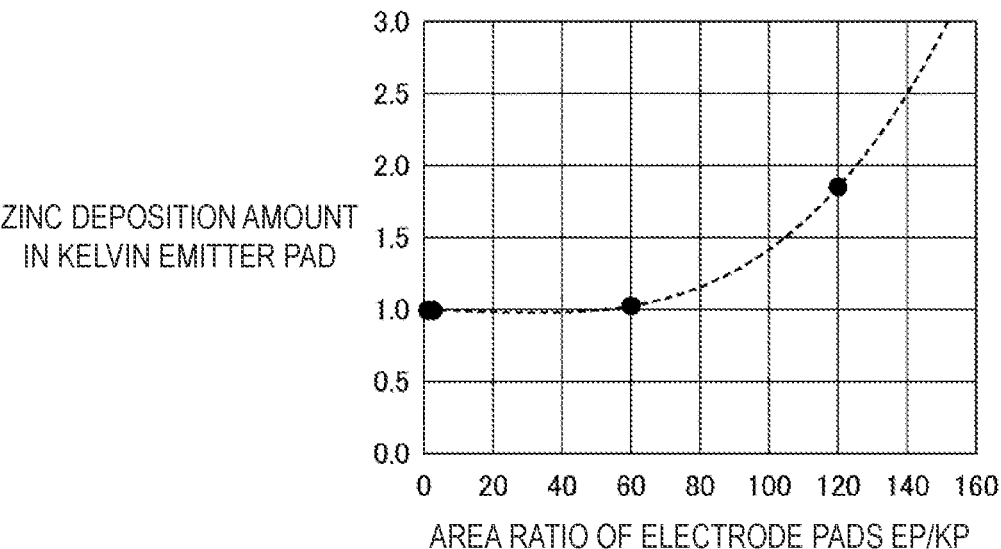
FIG. 9 is a diagram showing the relationship between the area ratio of the electrode pads (emitter pad/Kelvin emitter pad) and the zinc deposition amount in the Kelvin emitter pad.

As shown in FIG. 9, it was found that when the area ratio (EP/KP) is larger than 60, the zinc deposition amount is increased. Therefore, it is preferable that the configuration in the present embodiment is applied to a configuration in which the area ratio (EP/KP) is larger than 60. Also, it was found that when the area ratio (EP/KP) is 120 or more, the zinc deposition amount is further increased. Therefore, it is more preferable that the configuration in the present embodiment is applied to a configuration in which the area ratio (EP/KP) is 120 or more. Also, the ratio (RP/KP) of the planar occupied area of the relay pad RP to the plane occupied area of the Kelvin emitter pad KP shown in FIG. 1 is preferably 60 or less.

Second Embodiment

Next, a configuration of a semiconductor device according to the second embodiment will be described with reference to FIGS. 10 and 11.

Figure 10:
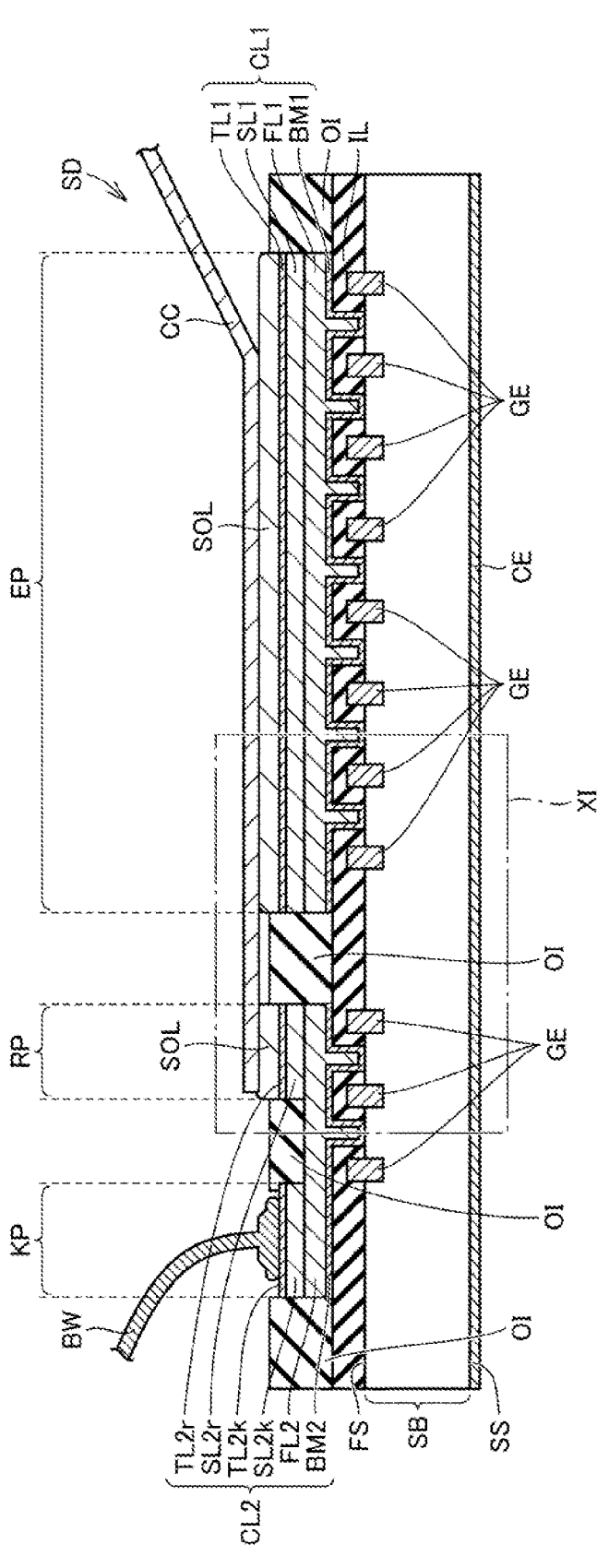
FIG. 10 is a cross-sectional view showing a configuration of a semiconductor device according to second embodiment.
Figure 11:
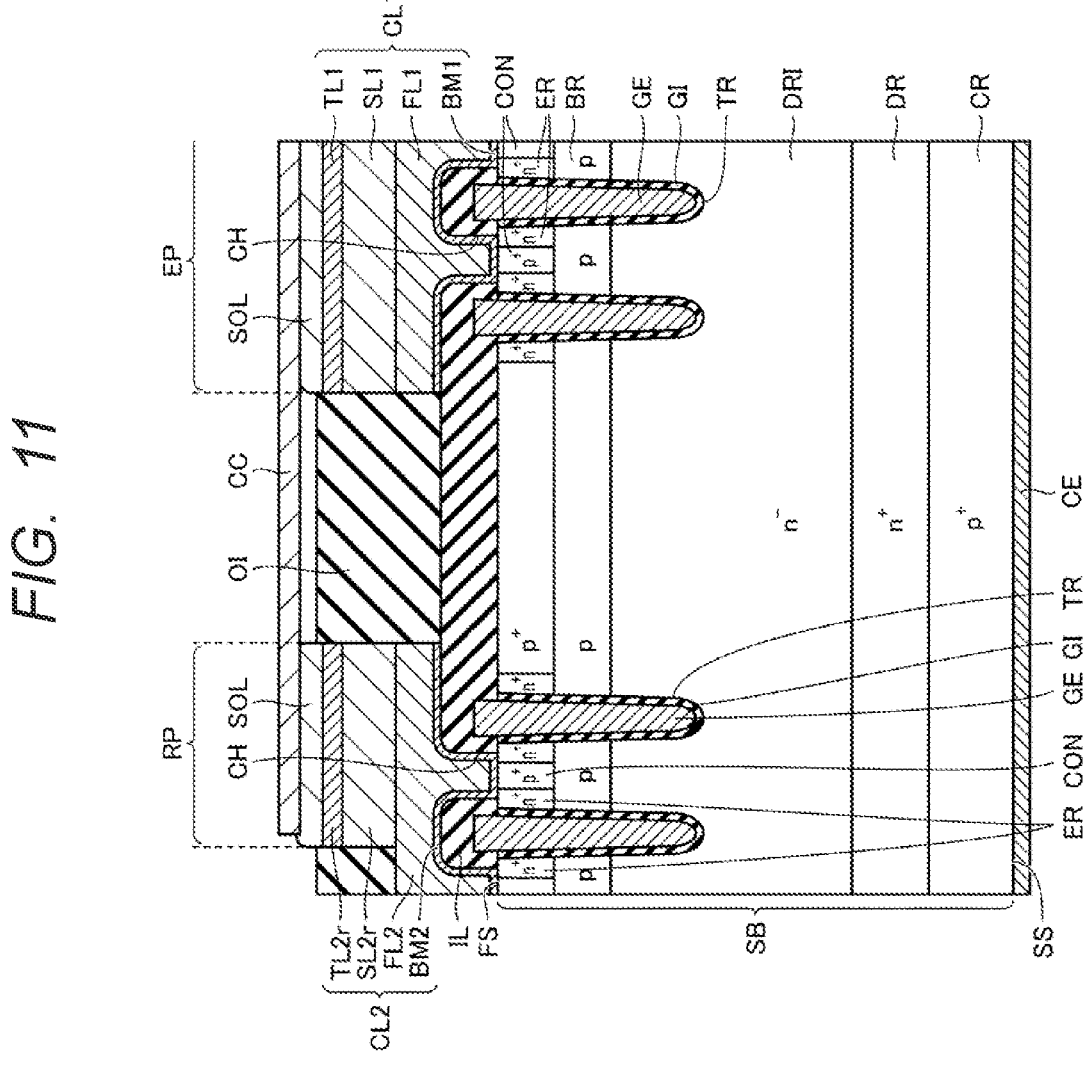
FIG. 11 is a cross-sectional view showing an enlarged XI portion of FIG. 10.

As shown in FIGS. 10 and 11, the configuration of the present embodiment is different from the configuration of the first embodiment in that the gate electrode GE and the n$^+$-type emitter region ER of the IGBT are arranged in a region directly below the second conductive layer CL2 and that the second conductive layer CL2 is directly connected to the n$^+$-type emitter region ER and the p-type contact region CON.

Since the configuration of the present embodiment other than the above is substantially the same as the configuration of the first embodiment, the same reference numerals are given to the same elements, and descriptions thereof will not be repeated.

In the present embodiment, as shown in FIG. 11, since the gate electrode GE and the n$^+$-type emitter region ER are arranged directly below the second conductive layer CL2, the area of the semiconductor chip can be reduced.

Third Embodiment

Next, a configuration of a semiconductor device according to the third embodiment will be described with reference to FIGS. 12 and 13.

Figure 12:
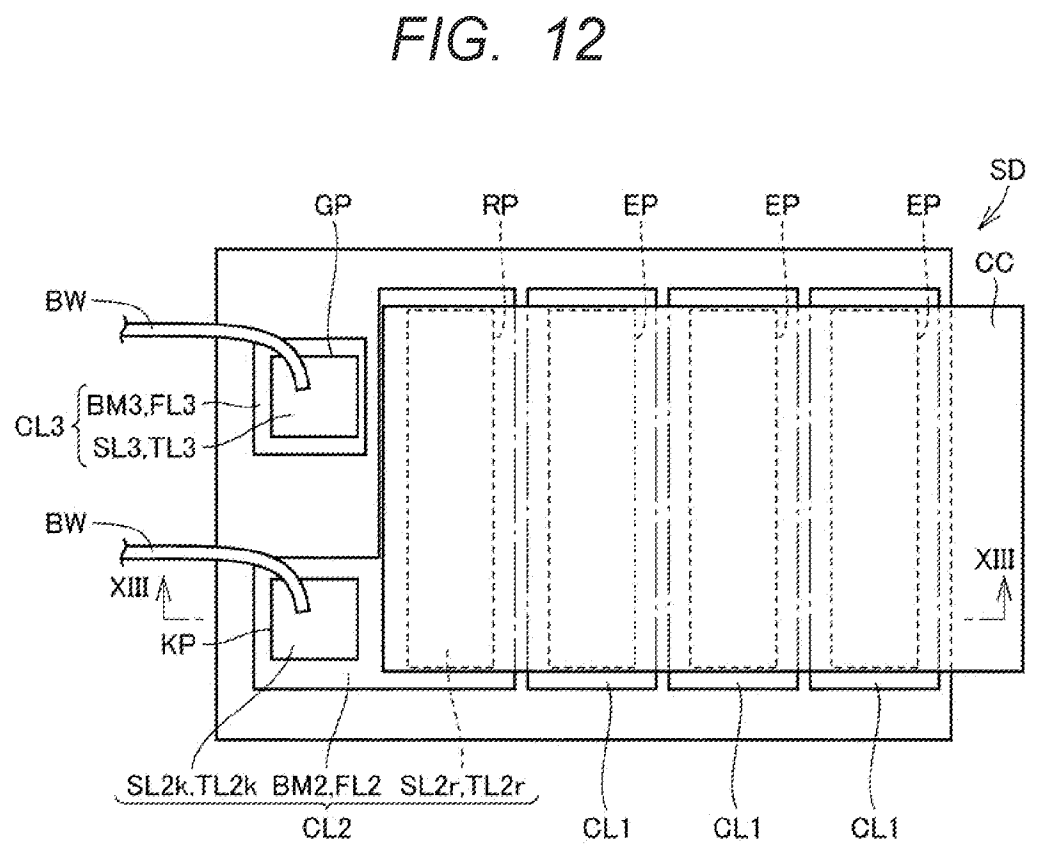
Figure 13:
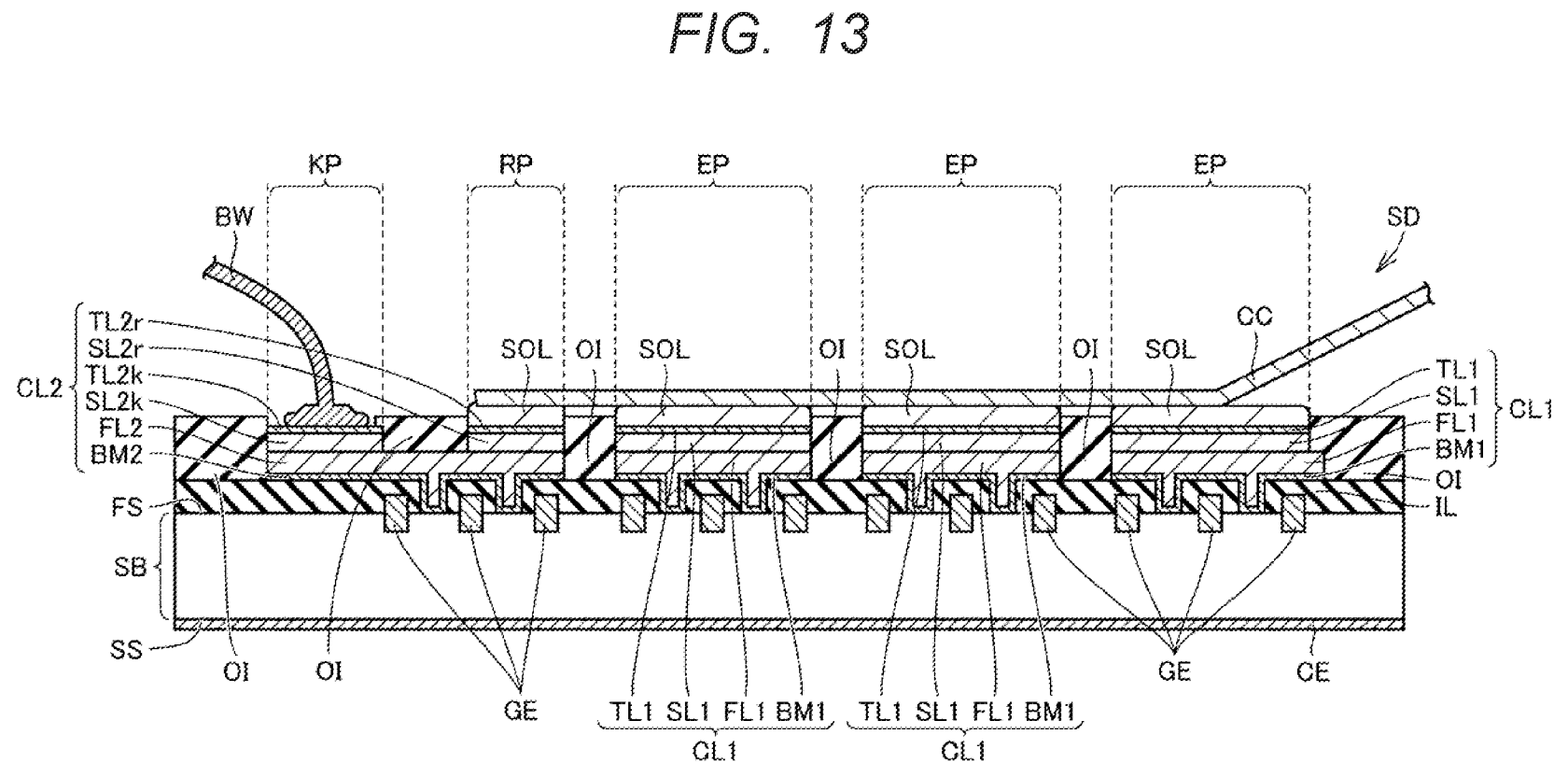

As shown in FIGS. 12 and 13, the configuration of the present embodiment is different from the configuration of the second embodiment in that it has a plurality of first conductive layers CL1 and in the planar shape of the relay pad RP and the second conductive layer CL2.

Each of the plurality of first conductive layers CL1 is separated from each other. The plurality of first conductive layers CL1 is, for example, three first conductive layers CL1. The plurality of first conductive layers CL1 may be two or four or more first conductive layers CL1.

Each of the plurality of first conductive layers CL1 has, for example, a rectangular planar shape. The plurality of first conductive layers CL1 is, for example, arranged side by side in a straight line in plan view. Specifically, each of the plurality of first conductive layers CL1 has a rectangular planar shape, and the plurality of first conductive layers CL1 are arranged side by side in a straight line along the lateral direction of the rectangular planar shape in plan view.

Each of the plurality of first conductive layers CL1 has emitter pads EP. Each of a plurality of emitter pads EP has, for example, a rectangular planar shape. The plurality of emitter pads EP is, for example, arranged side by side in a straight line in plan view. Specifically, each of the plurality of emitter pads EP has a rectangular planar shape, and the plurality of emitter pads EP is arranged side by side in a straight line along the lateral direction of the rectangular planar shape in plan view.

The second conductive layer CL2 has, for example, an L-shaped planar shape. The second conductive layer CL2 has the relay pad RP. The relay pad RP has, for example, a rectangular planar shape, and is arranged adjacent to the plurality of emitter pads EP in a straight line along the lateral direction of the rectangular planar shape in plan view.

The clip conductor CC is electrically connected to each of the plurality of emitter pads EP and the relay pad RP via the solder SOL. By dividing the emitter pad EP with a large area into a plurality, the stress of the metal film (Al layer, OPM film) is released. Thus, the curve of the wafer state after polishing the semiconductor substrate SB thinly and the curve of the chip state after dicing are reduced, there is a merit of improvement of ease of manufacture and defect rate reduction such as cracks.

Since the configuration of the present embodiment other than the above is substantially the same as the configuration of the second embodiment, the same reference numerals are given to the same elements, and descriptions thereof will not be repeated.

Others

In the above first embodiment to third embodiment, the vertical-type IGBT as an electric element formed in the semiconductor substrate SB is described. However, the electric element to which the present disclosure is applied is not limited to the vertical-type IGBT, and the electric element may be a vertical-type power MOSFET (Metal Oxide Semiconductor Field Effect Transistor) as shown in FIG. 14.

Figure 14:
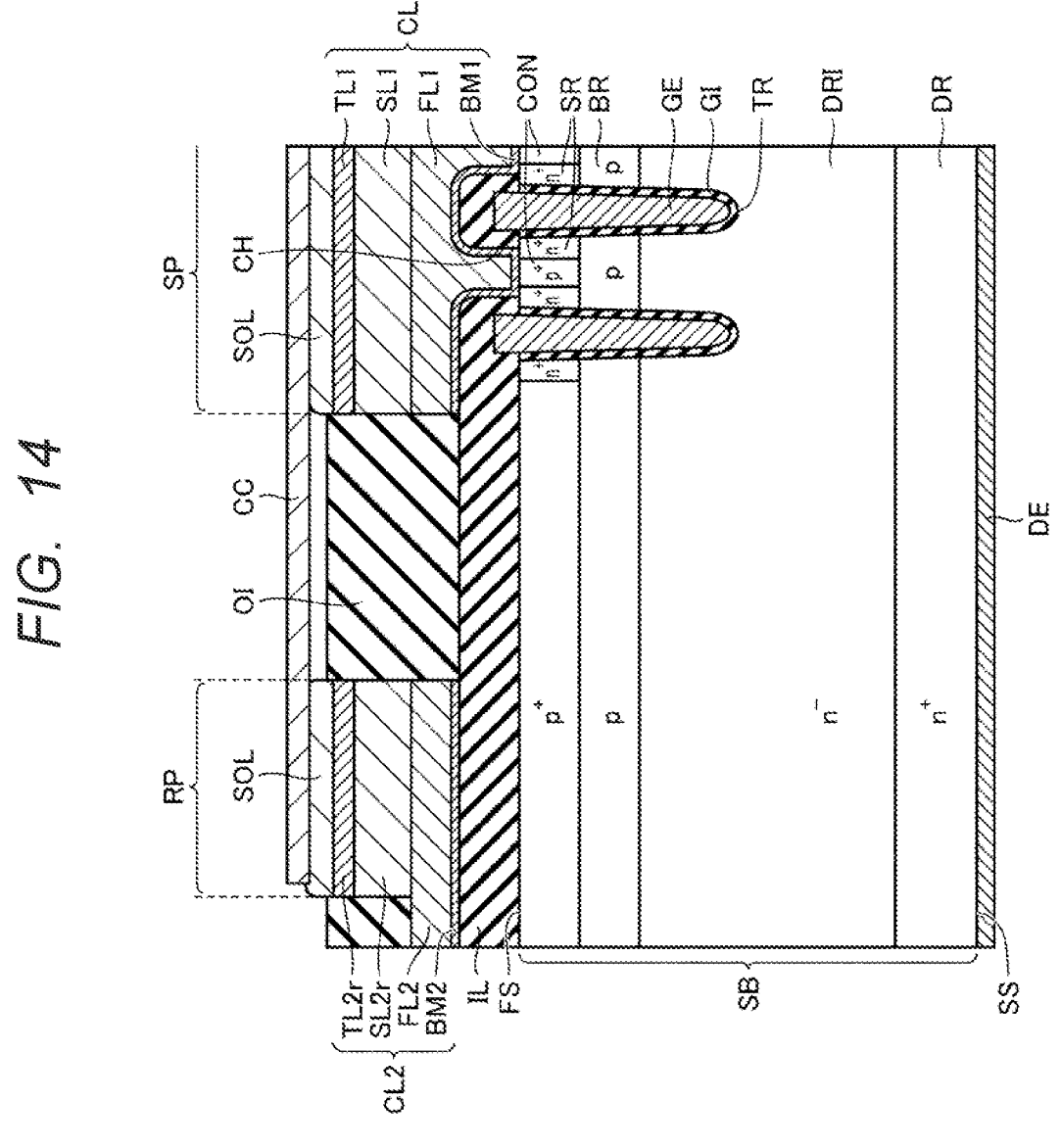
FIG. 14 is a cross-sectional view showing a configuration in which a MOSFET is formed in the semiconductor substrate.

As shown in FIG. 14, the vertical-type power MOSFET includes an n$^+$-type drain region DR, an n$^-$-type drift region DRI, a p-type base region BR, a p$^+$-type contact region CON, an n$^+$-type source region SR, and a gate electrode GE.

The n$^+$-type drain region DR is arranged on the second surface SS of the semiconductor substrate SB. The n$^-$-type drift region DRI is arranged in contact with the n$^+$-type drain region DRI. The n$^-$-type drift region DRI has an n-type impurity concentration lower than an n-type impurity concentration of the n$^+$-type drain region DR. The p-type base region BR is arranged on the n$^-$-type drift region DRI (first surface FS side with respect to the n$^-$-type drift region DRI) to form a pn junction with the n$^-$-type drift region DRI.

The p$^+$-type contact region CON and the n$^+$-type source region SR are arranged on the p-type base region BR (first surface FS side with respect to the p-type base region BR) so as to contact with the p-type base region BR. The p$^+$-type contact region CON has a p-type impurity concentration higher than a p-type impurity concentration of the p-type base region BR. The n$^+$-type source region SR forms a pn junction with each of the p$^+$-type contact region CON and the p-type base region BR.

In the semiconductor substrate SB, the trenches TR that reach the n$^-$-type drift region DRI from the first surface FS through each of the n$^+$-type source region SR and the p-type base region BR are provided. The gate dielectric layer GI is arranged along the wall surface of the trench TR. The inside of the trench TR is filled by the gate electrode GE. The gate electrode GE faces the p-type base region BR via the gate dielectric layer GI. Thus the power MOSFET has an insulated gate field effect transistor portion.

The first conductive layer CL1 configures a source electrode by contacting the n$^+$-type source region via the contact hole CH of the interlayer dielectric layer IL. The first conductive layer CL1 has the source pad SP exposed from the dielectric layer OI. In the present embodiment, the Kelvin emitter pad KP in the first embodiment and the second embodiment is the Kelvin source pad, and measures the potential of the n$^+$-type source region SR. The conductive layer DE arranged on the second surface SS of the semiconductor substrate SB configures a drain electrode DE by being in contact with the n$^+$-type drain region DR.

Even in such a MOSFET, the same effects as those of the first embodiment can be obtained. Although the invention made by the present inventor has been specifically described based on the embodiment, the present invention is not limited to the embodiment described above, and it is needless to say that various modifications can be made without departing from the gist thereof.

What is claimed is:

1. A semiconductor device, comprising:
a semiconductor substrate having a main surface;
a plurality of gate electrodes, each of the plurality of gate electrodes filling a trench;
a plurality of impurity regions, each of the plurality of impurity regions being a source region or an emitter region and arranged in the semiconductor substrate;
an interlayer dielectric layer arranged on the main surface;
a first conductive layer connected to the plurality of impurity regions, arranged on the interlayer dielectric layer and having a first electrode pad;
a second conductive layer arranged on the interlayer dielectric layer separately from the first conductive layer such that the plurality of gate electrodes and the plurality of impurity regions are not arranged in a region directly under the second conductive layer, the second conductive layer having a second electrode pad and a third electrode pad, the third electrode pad being electrically connected to the first electrode pad; and
a dielectric layer arranged on the interlayer dielectric layer and located between the first conductive layer and the second conductive layer,
wherein the first electrode pad is exposed from the dielectric layer,
wherein the second electrode pad is exposed from the dielectric layer,
wherein the third electrode pad is exposed from the dielectric layer,
wherein a bonding wire connected to the second electrode pad, wherein a clip conductor arranged on the first electrode pad and the third electrode pad and electrically connected to each of the first electrode pad and the third electrode pad, and
wherein a plane occupied area of the second electrode pad is smaller than a plane occupied area of the first electrode pad.

2. The semiconductor device according to claim 1, comprising:
a third conductive layer connected to the impurity region and arranged on the main surface separately from the first conductive layer,
wherein the third conductive layer has a fourth electrode pad,
wherein the clip conductor is arranged on the first electrode pad, the third electrode pad and the fourth electrode pad, and
wherein the clip conductor is electrically connected to the first electrode pad, the third electrode pad, and the fourth electrode pad.

3. The semiconductor device according to claim 1, wherein each of the first conductive layer and the second conductive layer includes:
a first layer including aluminum; and
a second layer arranged on the first layer and including metal different from aluminum.

4. The semiconductor device according to claim 1, wherein a gate electrode is not arranged in a region directly below the second conductive layer.

5. The semiconductor device according to claim 1, comprising:
a gate electrode arranged in a region directly below the second conductive layer.

6. The semiconductor device according to claim 1, wherein an element including a vertical-type insulated gate field effect transistor portion having the impurity region is formed in the semiconductor substrate.

7. A method of manufacturing a semiconductor substrate, the method comprising:
forming a plurality of gate electrodes in a semiconductor substrate such that each of the plurality of gate electrodes fills a trench;
forming a plurality of impurity regions in a semiconductor substrate, each of the plurality of impurity regions being a source region or an emitter region;
forming an interlayer dielectric layer on a main surface of the semiconductor substrate;
forming a first conductive layer and a second conductive layer on the interlayer dielectric layer, the first conductive layer being connected to the plurality of impurity regions and the second conductive layer being separated from the first conductive layer, wherein the plurality of gate electrodes and the plurality of impurity regions are not arranged in a region directly under the second conductive layer;
forming a dielectric layer on the interlayer dielectric layer, the dielectric layer exposing a first electrode pad of the first conductive layer, a second electrode pad of the second conductive layer and a third electrode pad of the second conductive layer;
connecting a bonding wire with the second electrode pad; and
connecting a clip conductor with each of the first electrode pad and the third electrode pad to electrically connect the first electrode pad with the third electrode pad, wherein a plane occupied area of the second electrode pad is smaller than a plane occupied area of the first electrode pad.

8. The method according to claim 7, wherein the first conductive layer and the second conductive layer are formed by separating a common conductive layer.

9. The method according to claim 8, wherein a forming the common conductive layer includes:

forming a first layer includes aluminum;

performing a zincate treatment to the first layer; and forming a second layer made of metal different from aluminum on the first layer by plating the zincate treated first layer.

* * * * *